United States Patent [19]

Sugiyama et al.

[11] Patent Number: 4,812,354

[45] Date of Patent: Mar. 14, 1989

[54] COLOR IMAGE RECORDING MATERIAL

[75] Inventors: Takeo Sugiyama, Takasago; Shigetoshi Hiraishi, Tokyo, both of Japan

[73] Assignee: Mitsubishi Paper Mills, Ltd., Tokyo, Japan

[21] Appl. No.: 48,943

[22] Filed: May 12, 1987

[30] Foreign Application Priority Data

May 14, 1986 [JP] Japan ................................ 61-110309
May 23, 1986 [JP] Japan ................................ 61-119929

[51] Int. Cl.⁴ .............................................. B41M 5/26
[52] U.S. Cl. .................................... 428/195; 428/484; 428/488.1; 428/913; 428/914; 430/252; 430/253; 430/254
[58] Field of Search .................... 428/195, 484, 488.1, 428/488.4, 913, 914, 500; 430/252-254

[56] References Cited

U.S. PATENT DOCUMENTS

| | | | |
|---|---|---|---|
| 4,112,138 | 9/1978 | Davis et al. | 427/401 |
| 4,572,684 | 2/1986 | Sato et al. | 427/265 |
| 4,588,315 | 5/1986 | Seto et al. | 427/265 |
| 4,615,932 | 10/1986 | Ohishi et al. | 428/484 |
| 4,710,445 | 12/1987 | Sanders | 430/257 |

Primary Examiner—Ellis P. Robinson
Assistant Examiner—P. R. Schwartz
Attorney, Agent, or Firm—Cushman, Darby & Cushman

[57] ABSTRACT

A colored image recording material comprising a support and hot-melt inks each comprising at least one coloring material, a photosetting resin and a polmerization initiator and applied on one side of the support can provide colored images excellent in resolving power and image storing properties by an image forming method.

13 Claims, No Drawings

COLOR IMAGE RECORDING MATERIAL

BACKGROUND OF THE INVENTION

This invention relates to a recording material for forming color images by using hot-melt inks each comprising a coloring material and a thermosetting resin, and a method for forming color images by using such recording material.

Silver salt photographic system, which is excellent in resolving power, and non-silver salt photographic system, which includes electrostatic recording system and electrophotographic system, are known as color image forming methods. Non-silver salt system is inferior to silver salt system in color image quality, but as it enables reproduction of tones, this system is used for copying of color images, etc.

These systems, however, are complicated in the process for obtaining color images, so that their equipments are large in size and fine maintenance is required therefor, making these systems costly.

Recently, with the development of computers, request has been voiced for enabling reproduction of color images formed on CRT, etc., as "hard copies" so that one can see them by taking them up on his hand. For realizing this, several methods have been proposed in which color images are formed after converting the images into electric signal. In these methods, heat transfer system and ink jet system are most typical. In the former system, at least one coloring material is transferred to image receiving paper from transfer paper applied with plural coloring materials by using thermal head. This system enables a reduction in size of the apparatus and also makes it maintenance-free, but the image sharpness is poor since the image resolving power is decided by the size of the heat generating section of the thermal head. Also, this heat transfer system is subject to certain limitation on speed-up of recording as it is necessary to use transfer paper coated with coloring materials of at least three colors, viz. yellow, magenta and cyan, when forming a color image. It is another drawback to this system that the three color layers are consumed even when forming a single-color or 2-color image.

According to the ink jet system, images are formed on image receiving paper by spurting inks from the respective nozzles, so that this system has the problem that the nozzles might be choked up with ink. Also, as it is necessary to spurt inks of different colors from the respective nozzles for forming color images, there are required at least three nozzles.

On the other hand, Japanese Patent Unexamined Publication No. 59-230786 discloses a recording material which can provide a color image easily. According to this Japanese Publication, there is formed on image (or picture) elements a white opaque layer, which is then removed from necessary image element portions to give a color image. But this technique is disadvantageous in that the use of adhesive tape is necessary to remove the white opaque layer and resolving power is insufficient.

Therefore, there have been desired for an easier process for forming maintenance-free color images and color image recording materials used therefor.

SUMMARY OF THE INVENTION

An object of the present invention is to provide a recording material which is capable of forming color images having excellent resolving power and good keeping quality by a simple process. It is also envisaged to provide a method of forming such color images by using said recording material.

According to the present invention, there is provided an image recording material characterized in that hot-melt ink each comprising a mixture of at least one coloring material selected from yellow, magenta, cyan and black, a photosetting resin and a polymerization initiator are applied on one side of a support.

The present invention also provide an image forming method using an image recording material prepared by applying hot-melt inks each comprising a mixture of at least one coloring material selected from yellow, magenta, cyan and black, a photosetting resin and a polymerization initiator on one side of a support, characterized by the steps of exposing said recording material to light corresponding to image signal, curing the exposed portions of said hot-melt inks, placing the thus treated recording material on image receiving paper, and applying heat and/or pressure to the whole surface thereof to thereby obtain a color image.

DESCRIPTION OF THE PREFERRED EMBODIMENTS

The method of forming color images by using the color image recording material according to the present invention will be described in more detail below.

Firstly, said color image recording material is exposed to light corresponding to image signal to cure the exposed portions of said hot-melt inks.

There is produced a difference in adhesive force to the support between the cured portion and the non-cured portion of each hot-melt ink, so that when heat and/or pressure are applied to the whole surface after said color recording material has been placed on image receiving paper, the hot-melt inks corresponding to image signals are transferred to the image receiving paper to form the desired image.

In carrying out exposure to light in the present invention, only one type of light may be applied in correspondence to image signal to the parts of the coloring materials of three or four different colors, viz. yellow, magenta and cyan, or these three colors plus black. It is also possible to form color images by applying lights of two or more different wavelengths by selecting the photosetting resin, polymerization initiator or sensitizer for each coloring material.

Said color image recording material can be obtained by disposing the hot-melt inks containing the respective coloring materials and a photosetting resin successively in a predetermined order without overlapping each other or in a pattern of strikes or mosaic. Since these hot-melt inks form the final color image, said inks are disposed successively in the required areas. Especially in case the inks are disposed successively in a pattern of stripes or mosaic, it is desirable that the respective hot-melt inks are present so as to have image elements as many as possible in a unit area. The finer the area of ink, the better becomes the quality, especially resolving power of the obtained image. In view of this, the width of each hot-melt ink should be in the range of 1 to 500μ, preferably 5 to 250μ, more preferably 5 to 120μ. As for the coloring material used for each hot-melt ink, dye or pigment may be used if a good color balance is provided by each combination. Use of coloring material with good keeping quality is preferred for providing the long-lasting image. Two or more different types of coloring material may be used in combination in one hot-melt ink.

Examples of the coloring materials usable in this invention are shown below: pigments including black pigments such as carbon black, acetylene black, lamp black, bone black, graphite, iron black, mineral black, aniline black, cyanine black, etc.; yellow pigments such as yellow lead, zinc yellow, barium chromate, cadminum yellow, yellow iron oxide, Chinese yellow, titanium yellow, lead cyanamide, lead acid calcium, Naphthol Yellow S, Hansa Yellow 10G Hansa Yellow GR, Hansa Yellow A, Hansa Yellow RN, Hansa yellow R, Pigment Yellow, Benzidine Yellow, Benzidine Yellow G, Benzidine Yellow GR, Permanent Yellow NCG, Vulcan Fast Yellow 5G, Vulcan Fast Yellow R, Tartrazine Lake, Quinoline Yellow Lake, Anthracene Yellow 6GL, Permanent Yellow FGL, Permanent Yellow H10G, Permanent Yellow HR, Anthrapyrimidine Yellow, etc.; orange pigments such as chrome orange, chrome vermilion, Sudan I, Permanent Orange, Lithol Fast Orange, Permanent Orange GTR, Hansa Yellow 3R, Vulcan Fast Orange GG, Benzidine Orange G, Persian Orange, Indanthrene Brilliant Orange GK, Indanthrene Brilliant Orange RK, Indanthrene Brilliant Orange, etc.; brown pigments such as iron oxide, amber, Permanent Brown, Para Brown, etc.; red pigments such as red iron oxide, red lead, silver vermilion, cadmium red, cadmium mercury red, antimony red, Permanent Red 4R, Para Red, Fire Red, Parachlororthonitroaniline Red, Lithol Fast Scarlet G, Brilliant Fast Scarlet, Western Vermilion, Brilliant Carmine BS, Permanent Red F2R, Permanent Red F4R, Permanent Red FRL, Permanent Red FRLL, Permanent Red F4RH, Fast Scarlet VD, Vulcan Fast Rubin B, Vulcan Fast Pink G, Light Fast Red Toner B, Light Fast Red Toner R, Permanent FB, Pyrazolone Red, Lithol Red, Lake Red C, Lake Red D, Anthocin B, Brilliant Scarlet G, Lithol Rubin GK, Permanent Red F5R, Brilliant Carmine 6B, Pigment Scarlet 3B, Bordeaux 5B, Toluidine Maroon, Permanent Bordeaux F2R, Helio Bordeaux BL, Bordeaux 10B, BON Maroon Light, BON Maroon Medium, Eosine Lake, Rhodamine Lake B, Rhodamine Lake Y, Alizarine Lake, Thioindigo Red B, Thioindigo Maroon, Permanent Red BGR, PV Carmine HR, Monolite Fast Red YS, Permanent Red BL, etc.; purple pigments such as cobalt purple, manganese purple, Fast Violet B, Methyl Violet Lake, Dioxine Violet, etc.; blue pigments such as ultramarine, prussian blue, cobalt blue, cerulean blue, asbolite, Alkali Blue Lake, Peacock Blue Lake, Victorian Blue Lake, non-metal Phthalocyanine Blue, Phthalocyanine Blue, Fast Sky Blue, Indathrene Blue RS, Indathrene Blue BC, Indigo, etc.; green pigments such as chrome green, zinc green, chromium oxide, viridian, emerald green, cobalt green, Pigment Green B, Naphthol Green B, Green Gold, Acid Green Lake, Malachite Green Lake, Phthalocyanine Green, polychlorobrome, copper phthalocyanine, etc.

The dyes usable as coloring material in this invention are the color dyes of monoazo type, diazo type, metal complex salt monoazo type, anthraquinone type, phthalocyanine type, triallylmethane type, etc. Examples of these dyes, when expressed by color index number, are as follows:yellow: 11020, 11021, 12055, 12700, 18690, 18820, 47000, etc.; red: 12010, 12150, 12715, 26105, 26125, 27291, 45170B, 60505, etc.; green; 61565, etc.; blue: 61100, 61705, 61525, 62100, 42563B, 74350, etc.; black: 12195, 26150, 50415, etc.

It is possible to obtain the color image recording material of this invention by merely providing such coloring material along with a photosetting resin, polymerization initiator, binder, and wax, and if necessary, a photosensitizer and other necessary additives on a support by using the conventional printing and coating techniques such as gravure printing, solvent coating, hot-melt coating, etc. Aqueous coating is also usable for certain types of material.

The photosetting resin used in the present invention is selected from photodimerized type resins having photosensitive groups such as cinnamic acid residue, cinnamylidene residue, $\alpha,\beta$-unsaturated ketone residue, cumalin residue, anthracene residue, $\alpha$-phenylmaleimide residue, benzophenone residue, stilbene residue, etc., or photo-polymerized type resins having ethylenenic unsaturated double bonds such as acryloyl group, methacryloyl group, allyl group, vinyl group, unsaturated polyester group, vinyloxy group, acrylamide group, etc. photopolymerized type resins having ethylenic unsaturated double bonds, especially those having vinyl groups are preferred.

As the polymerization initiator for polymerizing the photosetting resin, there can be used the known compounds usually employed for such purpose. Examples of such compounds are benzophenones, benzoinalkylethers, Michler's ketone, thioxanthones, sulfides, diazos, acetophenones, peroxides, aromatic amines, anthraquinones, and halides. In order to expand the photosensitive wavelength region, a photosensitizer can be used. As the photosensitizer, there can be used nitro compounds, amino compounds, ketones, quinones, anthrones and the like. In order to further improve the aging qualities, a stabilizer such as radical polymerization inhibitor, modifier, diluent such as relatively low-molecular weight oligomer or monomer, and the like may be contained.

If necessary, there can be also contained a pigment dispersant, thickener, fluidity improver, defoaming agent, foam-inhibitor, releasing agent, foaming agent, introfier, fluorescent whitening agent, ultraviolet absorber, antioxidant, antiseptic and the like.

Examples of the binder usable in this invention include the following: oxidized starch, etherified starch, cellulose derivatives such as carboxymethyl cellulose, hydroxyethyl cellulose, etc., casein, gelatin, soybean protein, polyvinyl alcohol and its derivatives, maleic anhydride resins, conjugated diene type copolymer latices such as ordinary styrene-butadiene copolymer, methyl methacrylate-butadiene copolymer, etc., acrylic polymer latices such as polymers or copolymers of acrylic esters and methacrylic esters, vinyl polymer latices such as ethylene-vinyl acetate copolymer, latices of these polymers having the functional groups modified by monomers containing functional groups such as carboxyl group, aqueous adhesives of thermosetting synthetic resins such as melamine resin, urea resin, etc., and synthetic resin adhesives such as polymethyl methacrylate, polyurethane resin, polyester resin, vinyl chloride-vinyl acetate copolymer, polyvinyl butyral, alkyd resin, etc. These compounds can be used either singly or in combination. The amount of the binder used is not critical in this invention; it can be used in any amount suited for effecting desired adhesion to the support. It should be noted, however, that if the binder is used in an excess amount, the hot-melt ink may not be properly transferred by heating and/or pressing because of too strong adhesion to the support.

The waxes usable in this invention include vegetable waxes such as rice wax, Japan wax, candelilla wax, etc., animal waxes such as lanoline, beeswax, shellac wax, etc., mineral waxes such as montan wax, synthetic waxes such as paraffin wax, microcrystalline wax, oxidized paraffin wax, chlorinated paraffin wax, ricinoleic acid amide, lauric acid amide, erucic amide, palmitic acid amide, oleic acid amide, 12-hydroxystearic acid, distearyl ketone, ethylenebisstearic acid amide, etc., metallic soaps such as sodium stearate, sodium palmitate, potassium laurate, zinc stearate, aluminum stearate, magnesium stearate, lead stearate, dibasic barium stearate, etc., higher alcohols such as palmityl alcohol, stearyl alcohol, cetyl alcohol, etc., and synthetic polyalcohols such as polyethylene glycol, polypropylene glycol, etc.

In any case, it is desirable that the binder and wax used in this invention are the ones which absorb as little light used for exposure as possible.

A solvent is usually used for printing and coating practiced for obtaining the color image recording material according to this invention. As such solvent, there can be used, for example, methyl ethyl ketone, acetone, ethyl acetate, tetrahydrofuran, dichloromethane, dichloroethane, toluene, methanol, ethanol and the like.

Ultraviolet light, visible light and infrared light can be used as the light applied for curing the photosetting resin used in this invention. As the light source, sunlight, xenon lamp, low-pressure or highpressure mercury lamp, tungsten lamp, fluorescent lamp, and various types of laser oscillators can be used. From these light sources, any desired one can be chosen by selecting the type of the photosetting resin, sensitizer and polymerization initiator used.

Exposure can be conducted either from the front side or from the back side of the color image recording material but in case it is conducted from the back side, that is, from the support side of the recording material, it is necessary that the support be made of a material which is previous to light of the wavelength used for the exposure. Heating is conducted from the support side.

The support used in this invention may be transparent, semitransparent or opaque. As such support, it is possible to use, for example, paper, various types of nonwoven fabric, synthetic paper, plastic film, or composite sheet made by combining them. The support material should be one which won't be denatured by heating. Polyethylene terephthalate is preferably used as support material.

The present invention will hereinafter be described more particularly according to the examples thereof.

EXAMPLE 1

For producing a color image recording material, the following materials were dissolved or dispersed in a toluene/MEK (8/2) mixed solvent in the shown amount ratios to prepare a yellow hot-melt ink.

Materials

Coloring material, Yellow LSD-Y (Nippon Kayaku Co., Ltd.): 1.2 parts by weight
Photosetting resin, Arrownix M-8060 (Toagosei Chemical Industry Co., Ltd.): 48.8 parts by weight
Polymerization initiator, Irgacure 907 (Ciba Geigy): 1.2 parts by weight
Binder, Vylon 20 SS (Toyobo Co., Ltd.): 36.6 parts by weight
Wax, paraffin wax: 12.2 parts by weight There was also prepared magenta and cyan hotmelt inks in the same way and with the same composition except that said yellow coloring material was replaced by magneta Kayaset Red (Nippon Kayaku Co., Ltd.) and cyan SOT-Blue G (Hodogaya Chemical Co., Ltd.), respectively.

Then said inks were coated on a 6 μm polyethylene terephthalate support to a dry coating weight of 3.5 g/m2, and the recurring units (210 mm transversely and 297 mm longitudinally) consisting of said yellow, magenta and cyan hot-melt inks were arranged in a predetermined order without overlapping each other by gravure printing to obtain a color image recording material.

The respective parts of the color image on CRT were resolved into blue, green and red colors, and after converting them into electric signals and further subjecting them to optical conversion, ultraviolet light was applied to the positions corresponding to the yellow, magenta and cyan coloring materials in said recording material. After exposure, the ink side of said recording material was placed on ordinary paper (heat transfer image receiving paper TTR-T made by Mitsubishi Paper Mills, Ltd.) and they were passed through heated rolls. As a result, a beautiful color image was obtained.

EXAMPLE 2

The process of Example 1 was repeated except that the hot-melt inks were arranged in a pattern of stripes by gravure printing instead of arranging them in a predetermined order without overlapping each other to obtain a color image recording material.

The respective parts of the color image on CRT were resolved into blue, green and red colors, and after converting them into electric signals and further subjecting them to optical conversion, ultraviolet light was applied to the positions corresponding to the yellow, magenta and cyan coloring materials in said recording material. After exposure, the ink side of said recording material was placed on ordinary paper (heat transfer image receiving paper TTR-T made by Mitsubishi Paper Mills, Ltd.) and they were passed through heated rolls. There was obtained a beautiful color image.

As described above, according to the present invention, a color image recording material can be obtained by successively applying on a support the hot-melt inks prepared by mixing the respective coloring materials, a photosetting resin, and a polymerization initiator, and by use of such recording material, it is possible to obtain high-quality color images with a simple process. Thus, in view of the growing demand for recording of color images in these days, the present invention is of much industrial significance.

What is claimed is:

1. An image recording material comprising a support and a hot-melt ink composition prepared by mixing at least one coloring material selected from yellow, magenta, cyan and black dyes and pigments, a wax, a photosetting resin and a polymerization initiator and said composition being applied to one side of the support.

2. An image recording material according to claim 1, wherein two or more coloring materials selected from yellow, magenta, cyan and black are used.

3. An image recording material according to claim 1, wherein three coloring materials of yellow, magenta and cyan are used.

4. An image recording material according to claim 1, wherein four coloring materials of yellow, magenta, cyan and black are used.

5. An image recording material according to claim 1, wherein the hot-melt inks are arranged successively in a pattern of stripes or mosaic.

6. An image recording material according to claim 5, wherein the width of each hot-melt ink is 5 to 120 μm.

7. An image recording material according to claim 1, wherein the hot-melt inks are arranged in a predetermined order without overlapping each other.

8. An image recording material according to claim 1, wherein a photosetting resin is contained in each hot-melt ink in an amount of 10 to 70% by weight based on the total amount of said ink.

9. An image recording material according to claim 8, wherein a photosetting resin is contained in an amount of 30 to 60% by weight.

10. An image recording material according to claim 1, wherein the photosetting resin has unsaturated double bonds.

11. An image recording material according to claim 10, wherein the photosetting resin has vinyl groups.

12. An image recording material according to claim 1, wherein a polymerization initiator is contained in each hot-melt ink in an amount of 0.01 to 10% by weight based on the total amount of said ink.

13. An image recording material according to claim 12, wherein the polymerization initiator is contained in an amount of 0.1 to 5% by weight.

* * * * *